United States Patent [19]

Matney

[11] Patent Number: 4,585,989
[45] Date of Patent: Apr. 29, 1986

[54] 50% POINT OF AMPLITUDE AND PHASE DETECTOR

[75] Inventor: Earl G. Matney, Newberg, Oreg.

[73] Assignee: Tektronix, Inc., Beaverton, Oreg.

[21] Appl. No.: 611,798

[22] Filed: May 18, 1984

[51] Int. Cl.[4] .......................................... G01R 25/02
[52] U.S. Cl. ............................. 324/83 D; 324/83 FE; 307/350; 307/359
[58] Field of Search ............... 324/83 D, 83 R, 78 D, 324/79 D, 83 FE, 140 R, 140 D, 79 N, 77 A; 307/350, 351, 354, 359; 328/151, 115, 116; 330/9, 259

[56] References Cited

U.S. PATENT DOCUMENTS

| | | | |
|---|---|---|---|
| 3,560,851 | 2/1971 | Gaines | 324/83 D |
| 4,001,680 | 1/1977 | Bylund | 324/83 FE |
| 4,011,503 | 3/1977 | Ferrara | 324/83 D |
| 4,316,150 | 2/1982 | Crosby | 307/511 |

*Primary Examiner*—Reinhard J. Eisenzopf
*Assistant Examiner*—G. Peterkin
*Attorney, Agent, or Firm*—William A. Birdwell

[57] ABSTRACT

A 50% point of amplitude and phase detector. A differential amplifier produces non-inverted and inverted signals representative of a periodic input signal. Respective sample and hold circuits sample the levels of the non-inverted and inverted signals at predetermined points and the difference is input to the differential amplifier to equalize the position of those signals. The crossover of the non-inverted and inverted signals is detected by a gated differential amplifier whose output controls an oscillator from which the gating signal is derived to lock the phase of the oscillator output with the phase of the periodic signal.

13 Claims, 2 Drawing Figures

50% POINT OF AMPLITUDE AND PHASE DETECTOR

BACKGROUND OF THE INVENTION

This invention relates to a signal amplitude and phase detection systems and, in particular, to systems for determining the phase of a periodic signal with reference to the point at which it is at 50% of its maximum amplitude.

In signal processing and measurement systems it is often necessary to identify a particular point in the waveform of a periodic signal and to synchronize the phase of the output of an oscillator based upon that point. For example, in measuring the characteristics of a television waveform using a vector-scope to compare the amplitude and phase of one component of a video signal with the amplitude and phase of another, it is desirable to generate a reference signal locked in phase with the 50% amplitude point of the horizontal sync pulse of that video signal. This is typically accomplished by employing a "sync stripper" circuit, that is, one which produces a signal representative of the horizontal sync pulse only, followed by a circuit, such as a phase locked loop, which generates a signal locked in phase with the output of the sync stripper.

One example of the aforementioned approach is employed in the Leitch Model 730-N SC/H phase meter wherein a subcarrier signal is locked to the phase of the horizontal sync pulse. The maximum excursion of the sync pulse ("sync tip") is clamped to a known value, the sync pulse is assumed to have a predetermined amplitude, and the 50% point of sync is detected by comparing the sync signal to a level equal to 50% of that predetermined amplitude. This approach to 50% amplitude detection has the drawbacks that it is sensitive to actual signal amplitude and temperature. Insofar as it is used to establish the phase of a video signal it has the drawback that it requires a pulse generation stage to discriminate between horizontal sync and vertical interval pulses, which increases complexity and temperature sensitivity.

Another example of a sync stripper is employed in the Model 3258 SC/H phase meter manufactured by the Grass Valley Group of Tektronix, Inc. In this case, one sample and hold circuit determines the voltage of sync tip and another determines the voltage of the "back porch" of a first sync component of the video signal. A resistive divider establishes the 50% amplitude value, which is compared to the video signal to detect the 50% point on the next received sync pulse waveform. This approach also has the drawbacks of being sensitive to variations in the amplitude of the sync pulse and to temperature.

In a system for the detection of the 50% amplitude point of a waveform and synchronizing a signal to that point, it is desirable to employ circuitry that precisely recognizes that point with minimal complexity. Gated phase detector and phase locked loop circuitry which exhibits such characteristics is disclosed in Crosby U.S. Pat. No. 4,316,150, issued Feb. 16, 1982.

Therefore, it would be desirable to provide an improved 50% point of amplitude and phase detector system which is not dependent on a fixed signal amplitude and which exhibits improved temperature stability. In application to a video signal, such a circuit should also be accurate despite some leading edge distortion in the shape of the horizontal sync pulse. It would be particularly desirable to employ, in combination with the circuitry disclosed in the aforementioned Crosby patent, additional circuitry that would take advantage of its desirable characteristics.

SUMMARY OF THE INVENTION

The present invention overcomes the drawbacks of prior art 50% point of amplitude and phase detectors by providing a novel D.C. amplitude ("position") adjustment circuit used in conjunction with a gated phase detector and phase locked loop system. The circuit is particularly adapted for detecting when a composite, wide band video horizontal sync pulse is at 50% of its maximum amplitude and generating a reference signal locked in phase with that point.

A differential amplifier is provided for receiving a periodic signal, for example, wide band video, and an error signal. The differential amplifier generates both inverted and non-inverted output signals representative of the periodic signal. The relative positions of the differential amplifier output signals are adjusted by the error signal.

Sample and hold circuits are provided whereby the voltage of the inverted output of the differential amplifier is sampled at the time of maximum amplitude of a predetermined portion of the periodic signal (sync tip, in the case of composite video), and the voltage of the other non-inverted output is sampled at the time of maximum amplitude of a second portion of the periodic signal (back porch, in the case of composite video), the two portions representing opposite amplitude extremes of a selected component of the periodic signal (the horizontal sync pulse, in the case of composite video). The difference between these two voltages is found, and is employed to adjust the error signal input to the differential amplifier until the sample and hold outputs are equal. Hence, the maximum value of the inverted differential amplifier output signal is held equal to the maximum value of the non-inverted output signal within the limits of the selected signal component, these two values representing the two amplitude extremes of that component. As a result of this arrangement, changes in temperature that affect the characteristics of the differential amplifier and the sample and hold circuits are cancelled due to common mode rejection at the error detector input.

A phase detector is provided having a differential amplifier input, as shown in Crosby U.S. Pat. No. 4,316,150, herein incorporated by reference in its entirety. The inverted and non-inverted signals seen by the phase detector cross at the 50% point of amplitude of the selected component of the periodic input signal (e.g., the sync pulse), which is typically the point at which the respective waveforms exhibit the maximum rate of change of amplitude, thereby causing the output of the phase detector to reverse at the 50% point. This switching action is particularly fast due to the rate of change of the two input signals. The combination of comparing the inverted signal and the non-inverted signal at the phase detector with sampling those signals at sync tip and back porch of a composite, wide band video signal renders the identification of the 50% point of amplitude detection insensitive to changes in signal amplitude and to leading edge distortion.

The output from the phase detector is filtered and thereafter drives a voltage controlled oscillator, thereby producing a reference signal representative in phase of the input periodic signal. The output of the voltage controlled oscillator, which may be divided a predetermined amount, depending upon the frequencies required, is used to gate the differential amplifier of the phase locked loop on and off to eliminate the effect of events that occur on the input signal before and after that portion of the signal component to which phase is referenced, as well as input signal noise. In the particular case of wide band video, gating of the differential amplifier input to the phase locked loop at a rate equal to the horizontal sync pulse frequency and only on the leading edge of sync eliminates responsiveness to vertical interval pulses. A gate width less than the sync pulse width itself eliminates the effect of the trailing edge of the sync pulse, and minimizes the effect of other spurious signal artifacts.

Accordingly, it is a principal object of the present inventioin to provide a novel system for detecting the 50% amplitude point of a predetermined portion of a periodic signal.

It is another principal object of the present invention to provide a novel system for synchronizing a reference signal to the 50% amplitude point of a predetermined portion of a periodic signal.

It is a further object to provide a 50% point of amplitude detection system that is not dependent upon a fixed signal amplitude or position.

It is a further object of the present invention to provide improved temperature stability in a 50% point of amplitude and phase detector system.

It is yet a further object to provide a system for synchronizing a reference signal to the 50% point of amplitude of the horizontal sync pulse of wide band video that is accurate despite some leading edge distortion of the sync pulse.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
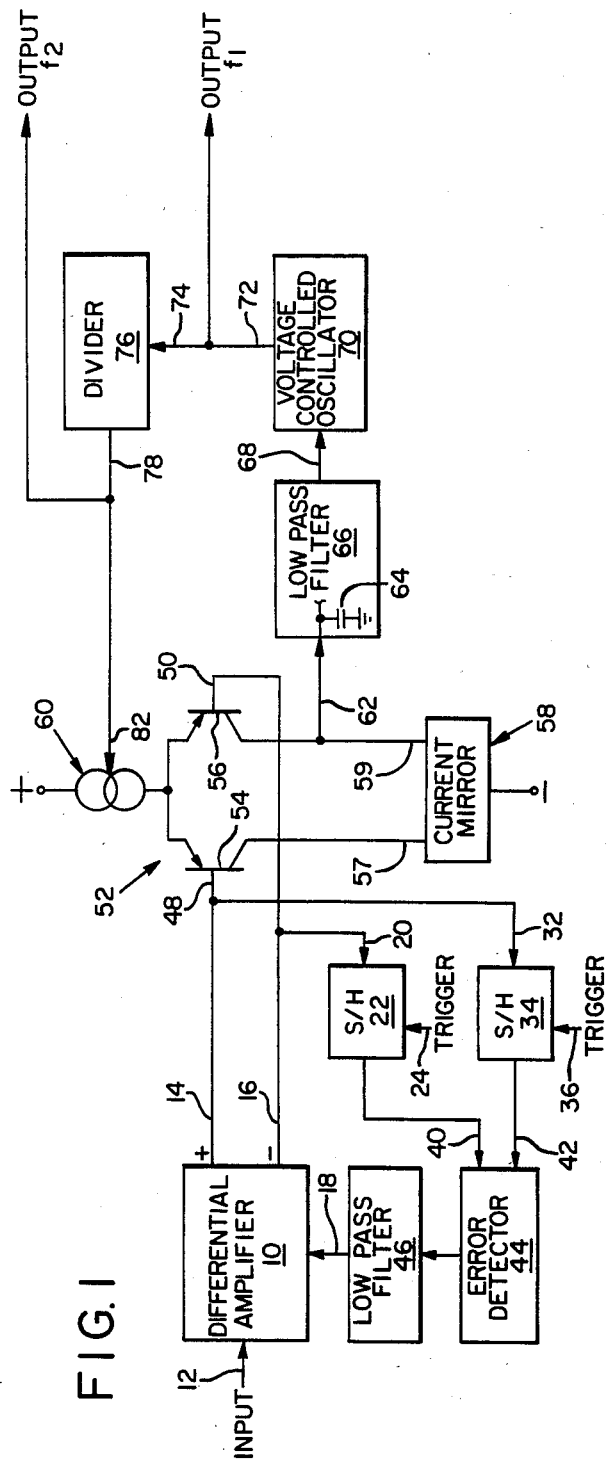
FIG. 1 is a functional block diagram of a preferred embodiment of the 50% point of amplitude and phase detector system of the present invention.

As shown in FIG. 1, a periodic signal whose 50% point of amplitude is to be detected so that a reference signal may be synchronized in phase with that point is provided to a differential amplifier 10 via a first input 12. The differential amplifier provides a non-inverted output 14 and an inverted output 16. The differential amplifier 10 is also provided with a second input 18 to which a bias signal, in this case an error signal, is provided. By varying the error signal at input 18 the relative positions of the outputs 14 and 16 can be adjusted.

Figure 2:
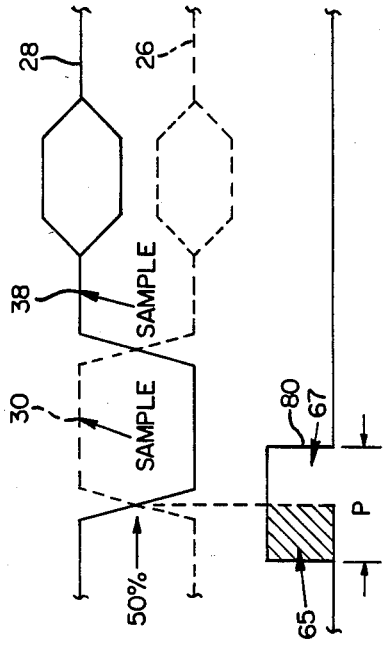
FIG. 2 shows representative inverted and noninverted output waveforms of a differential amplifier, and an illustrative gating signal applied to a phase detector in the preferred embodiment of the present invention.

The inverted output 16 of the differential amplifier 10 is connected to a signal input 20 of a first sample and hold circuit 22. The sample and hold circuit 22 is triggered by input 24 to sample the voltage level of the inverted signal at its maximum amplitude within the time frame associated with a predetermined component of the input signal, and to hold that value for a period of time determined by the trigger signal. (The term "level" is used herein to refer to the substantially instantaneous magnitude of a signal with respect to some reference, that is, within the capabilities of real sample and hold circuit.) In the case of a composite video signal as illustrated in FIG. 2, showing an inverted video signal 26, the maximum amplitude occurs at the center portion of the sync tip 30.

Similarly, the non-inverted output 14 of the differential amplifier 10 is connected to a signal input 32 of a second sample and hold circuit 34. This second sample and hold circuit is triggered by input 36 to sample the voltage level of the inverted output at the time of its maximum amplitude and to hold that value for a period of time determined by the trigger signal. In the case of a composite video signal, that sample occurs at the back porch 38 of the non-inverted signal 28, as shown in FIG. 2. Timing of the triggers of the two sample and hold circuits may be accomplished in a conventional way by means commonly known to the art based, for example, upon issuing a trigger signal a predetermined time following detection of the leading edge of a horizontal sync pulse.

The outputs of the sample and hold circuits 22 and 34, that is, the held voltage values, are connected to inputs 40 and 42, respectively of an error detector circuit 44. The error detector 44 determines the difference between the voltages at its inputs and feeds that value through low pass filter 46 to input 18 of the differential amplifier as an error signal. As a result, the bias of the differential amplifier is corrected to adjust the positions of the non-inverted and inverted outputs 14 and 16, respectively, at the time of sampling to be the same.

The differential amplifier 10, sample and hold circuits 22 and 34, error detector 44, and low pass filter 46 may be selected according to desired characteristics from among any of a variety of circuits commonly known to those skilled in the art. However, sample and hold circuits 22 and 34 should, preferably, be of the same type and located in the same environment so that ambient conditions effect them the same. Under those conditions, changes in circuit characteristics due to, for example, temperature and supply voltage, will be subject to common mode rejection.

The inverted and non-inverted outputs 14 and 16, respectively, of the differential amplifier 10 are also provided to differential inputs 48 and 50, respectively, of a differential phase detector circuit 52. In the preferred embodiment that circuit comprises a pair of bipolar transistors 54 and 56 whose respective collectors are connected to the input 57 and the output 59 of a current mirror 58, and whose emitters are connected to a switchable constant current source 60, the bases of the transistors providing the differential inputs. The operation of such a circuit is fully described in the aforementioned Crosby U.S. Pat. No. 4,316,150, which has been incorporated herein by reference.

In this application, as the non-inverted signal falls and the inverted signal rises the output 62 of the phase detector 52, driven by the current mirror 58, drains charge from a capacitor 64, as shown at 65 in FIG. 2. At the 50% of amplitude point this action is reversed so that the output 62 charges the capacitor 64 as shown at 67 of FIG. 2. By turning the phase detector on only during a gating period P, as shown in FIG. 2, the charge period can be made to equal the discharge period, provided that the gate is centered about the 50% crossing point.

The capacitor 64 is part of a low pass filter 66, the output of which is connected to the input 68 of a voltage controlled oscillator 70. The voltage controlled oscillator provides a reference signal output 72 at frequency $f_1$ which, in the preferred embodiment, is provided to the input 74 of a frequency divider 76. The output 78 of divider 76 at frequency $f_2$ provides the gating pulse 80 to input 82 of the current source 60. Thus, if the average voltage on capacitor 64 changes, the phase of the gating pulse 82 shifts, thereby adjusting the discharge and charge times about the 50% crossover point to bring the output 72 of the voltage controlled oscillator 70 into phase with the 50% amplitude point.

Depending upon the particular application the output 72 of the voltage controlled oscillator may be provided as one output and, assuming that a divider is used, its output 78 may be provided as a second output. It should be recognized, however, that while a divider may be desirable to provide two different frequency outputs, it is not necessary to the concept of this invention. In any case, where an output signal is to be locked in phase with the horizontal sync pulse of a composite video signal, the width of the gating pulse should be less than the width of the sync pulse.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

I claim:

1. A system for detecting the point at which a periodic signal is at 50% of its maximum amplitude, comprising:
   (a) differential amplifier means for producing, in response to said periodic signal, inverted and non-inverted output signals representative thereof, said differential amplifier means having a bias input for adjusting the relative positions of said output signals;
   (b) phase detector means, responsive to said output signals, for determining when the downward transition of one said output signal crosses the upward transition of the other said output signal; and
   (c) error correction means for providing to said bias input an error signal representative of the difference between the position of said inverted output signal and the position of said non-inverted output signal.

2. The system of claim 1 wherein said phase detector means comprises a differential amplifier having as one input said non-inverted output and as the other input said inverted output, said phase detector means providing an output signal representative of the phase of said periodic signal.

3. The system of claim 1 wherein said error correction means includes first sampling means for sampling the level of said inverted signal at the maximum amplitude of a predetermined component thereof and holding as an output the resultant value, second sampling means for sampling the level of said non-inverted signal at the maximum amplitude of a predetermined component thereof and holding as an output the resultant value, and error detector means for generating an error signal representative of the different between the output of said first sampling means and the output of said second sampling means.

4. The system of claim 3 wherein said error detector means includes a low pass filter means for low pass filtering said error signal.

5. The system of claim 3 wherein said first and second sampling means are of the same type and are disposed in substantially the same electrical and temperature environment.

6. The system of claim 3 wherein said phase detector means comprises a differential amplifier having as one input said non-inverted output and as another input said inverted output, said phase detector means providing an output signal representative of the phase of said periodic signal.

7. The system of claim 1 further comprising phase locking means for producing a system output signal whose frequency is a predetermined multiple of said periodic signal and whose phase has a fixed relationship to the point at which the downward transition of one said differential amplifier means output signal crosses the upward transition of the other said differential amplifier means output signal.

8. The system of claim 7 wherein said phase locking means includes means for turning said phase detector on only during a predetermined portion of said system output signal during which said crossing occurs.

9. The system of claim 7 wherein said phase detector means comprises a differential amplifier having as inputs said inverted and non-inverted output signals, and said phase locking means comprises means for low pass filtering the output of said phase detector, a voltage controlled oscillator responsive to said means for low pass filtering, and gating means for turning said phase detector on only during a predetermined portion of said system output signal.

10. The system of claim 9 wherein said predetermined multiple is greater than one, and further comprising means for dividing the output of said oscillator by said predetermined multiple to drive said gating means.

11. The system of claim 9 wherein said differential amplifier of said phase detector means comprises two bipolar transistors whose emitters are connected to a common current source and whose collectors are connected respectively to the input and output of a current mirror, the bases of the two transistors being connected respectively to said non-inverted and inverted outputs of said differential amplifier means, and the output of said phase detector means being taken at said connection of the collector of one transistor to the output of said current mirror.

12. A method for detecting the 50% amplitude point of a predetermined component of a periodic signal, comprising the steps of:
   (a) producing non-inverted and inverted signals representative of said periodic signal;
   (b) sampling the level of said inverted signal at the time of the maximum amplitude of said predetermined component;
   (c) sampling the level of said non-inverted signal at the time of the maximum amplitude of said predetermined component;
   (d) adjusting the positions of said inverted signal and said non-inverted signal to equalize said sampled levels; and
   (e) detecting the time of crossover of said inverted and non-inverted signals.

13. A method as recited in claim 12 further comprising the step of:
   (f) generating said reference signal in phase with said time of crossover.

* * * * *